United States Patent [19]
Tanaka et al.

[11] Patent Number: 5,278,794
[45] Date of Patent: Jan. 11, 1994

[54] NAND-CELL TYPE ELECTRICALLY ERASABLE AND PROGRAMMABLE READ-ONLY MEMORY WITH REDUNDANCY CIRCUIT

[75] Inventors: Yoshiyuki Tanaka, Tokyo; Yasuo Itoh, Kawasaki; Masaki Momodomi, Yokohama; Yoshihisa Iwata, Yokohama; Tomoharu Tanaka, Yokohama, all of Japan

[73] Assignee: Kabushiki Kaisha Toshiba, Kawasaki, Japan

[21] Appl. No.: 960,882

[22] Filed: Oct. 14, 1992

[30] Foreign Application Priority Data

Oct. 14, 1991 [JP] Japan .................. 3-264582

[51] Int. Cl.$^5$ .................. G11C 11/40; G11C 5/02
[52] U.S. Cl. .................. 365/200; 365/185; 365/230.03
[58] Field of Search .......... 365/200, 185, 225.7, 365/230.03, 230.08, 230.06

[56] References Cited

U.S. PATENT DOCUMENTS 5,075,890 12/1991 Itoh et al. .................. 365/185 X
5,220,518 6/1993 Haq .................. 365/200 X Primary Examiner—Eugene R. LaRoche
Assistant Examiner—Do Hyun Yoo
Attorney, Agent, or Firm—Oblon, Spivak, McClelland, Maier & Neustadt

[57] ABSTRACT

A NAND-cell type electrically erasable and programmable read only memory includes an array of rows and columns of memory cells associated with parallel bit lines on a semiconductive substrate. Each memory cell essentially consists of a floating-gate field effect transistor having a floating gate and an insulated control gate. The memory cell array is divided into a plurality of cell blocks, each of which includes NAND cell sections each including a predetermined number of a series-connected memory cell transistors. A redundancy cell section is provided which includes an array of redundancy memory cells containing at least one spare cell block. A row redundancy circuit is connected to a row decoder, and is responsive to an address buffer. The redundancy circuit replaces a defective block containing a defective memory cell or cells with the spare cell block.

15 Claims, 11 Drawing Sheets

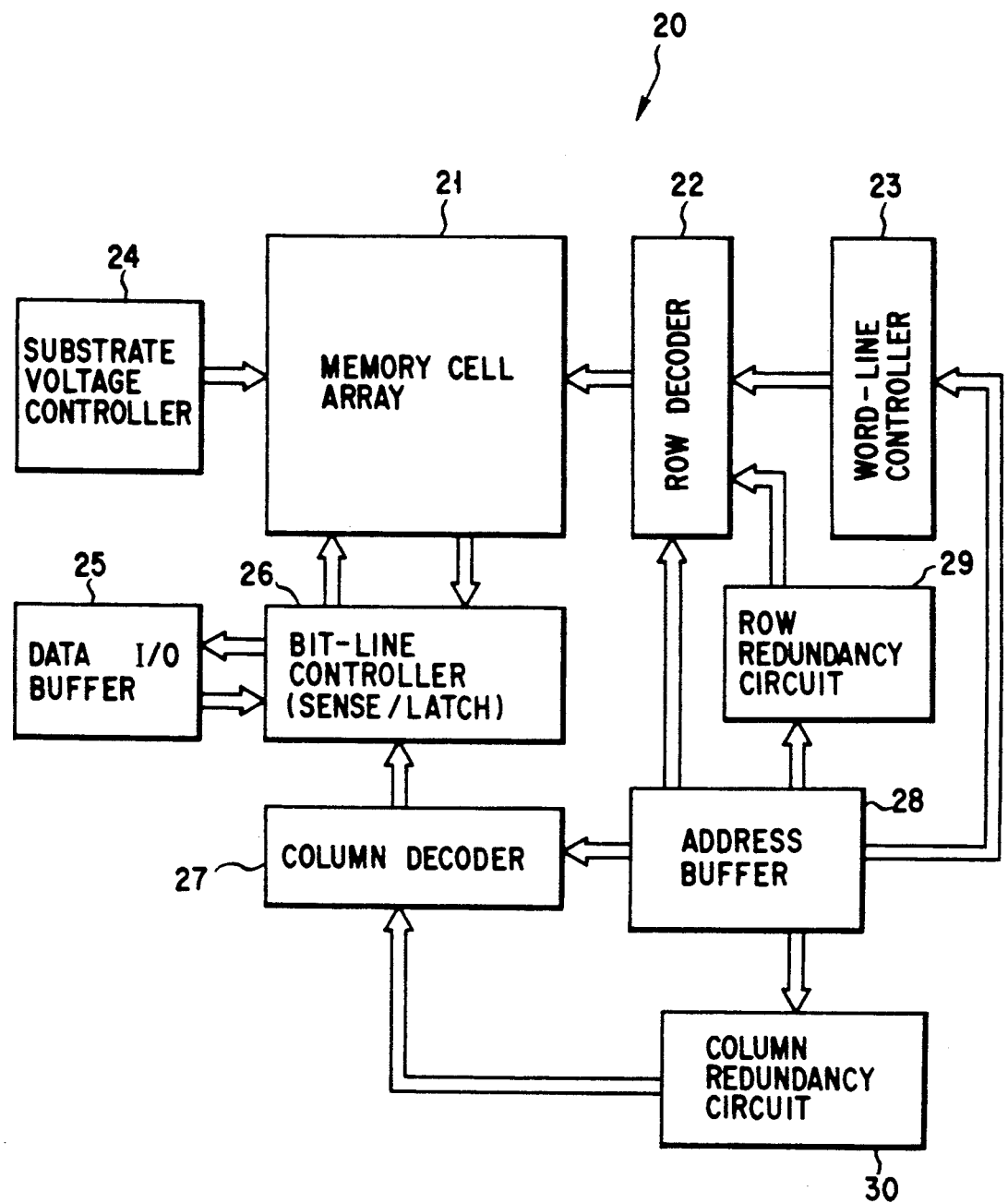
F I G. 1

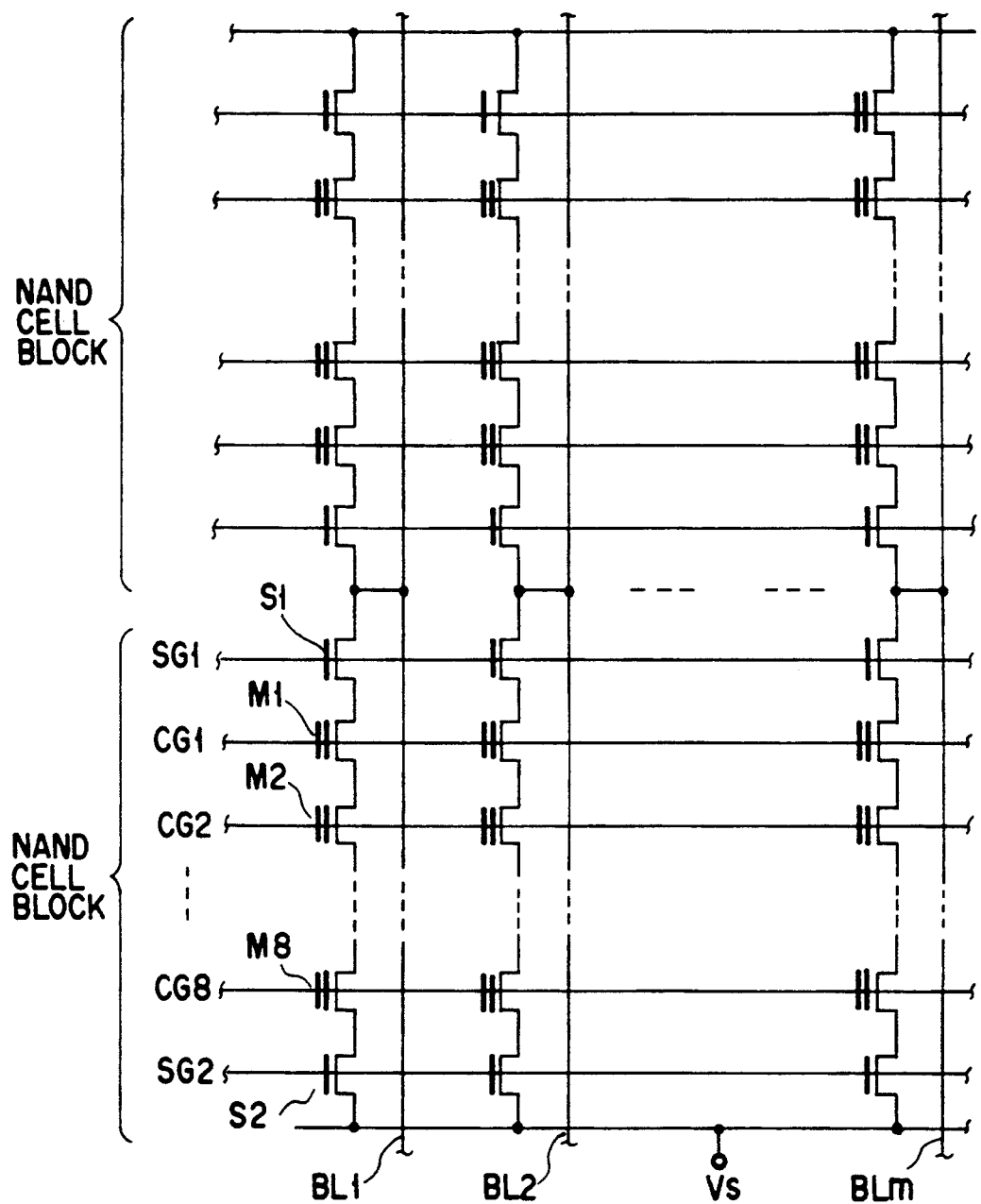
F I G. 4

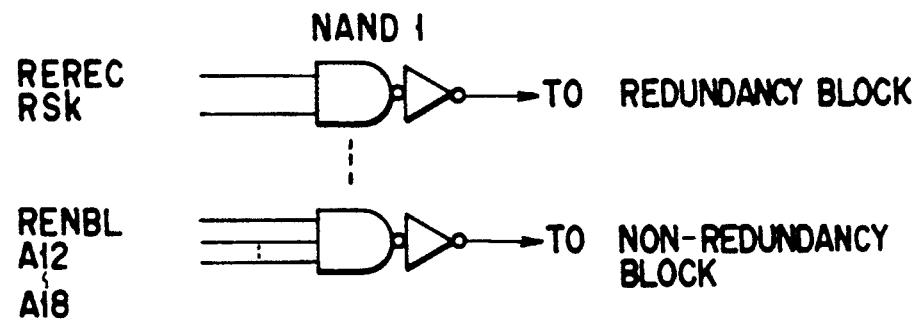
F I G. 7
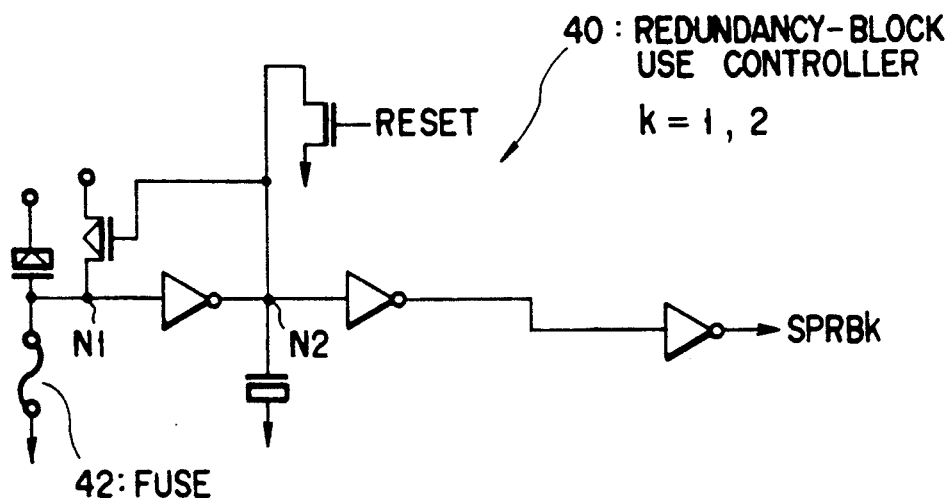
F I G. 8

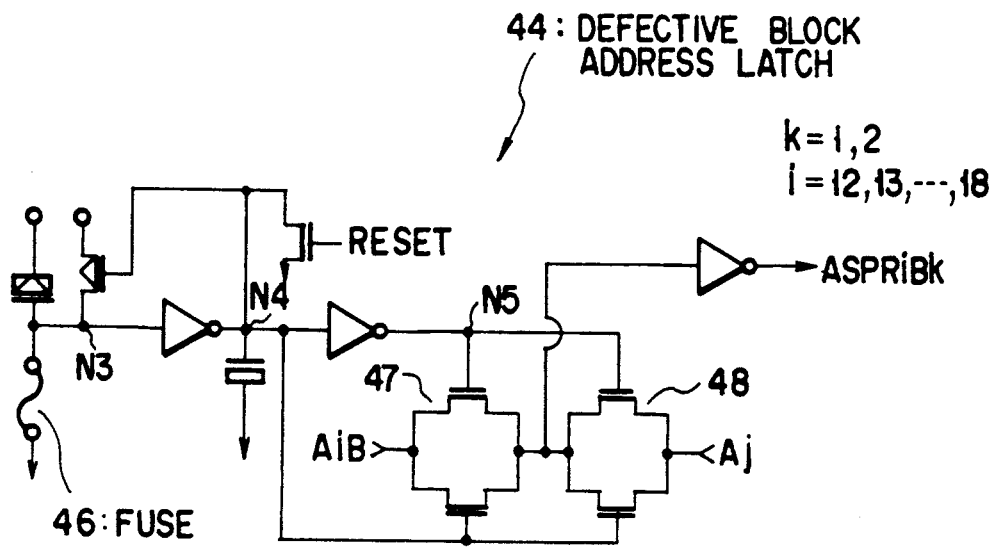
F I G. 9
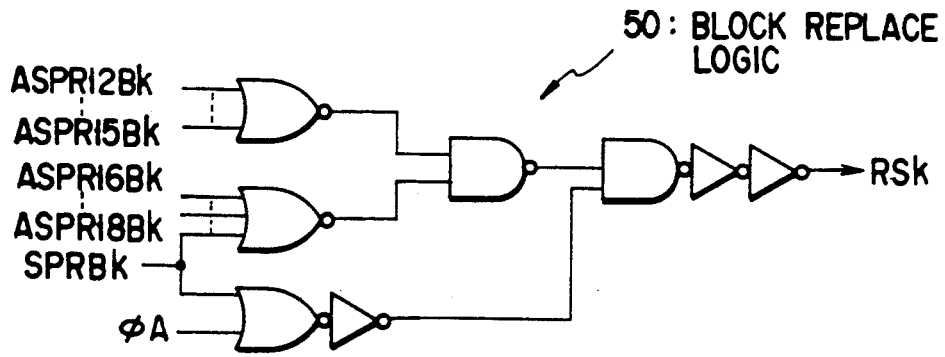
F I G. 10
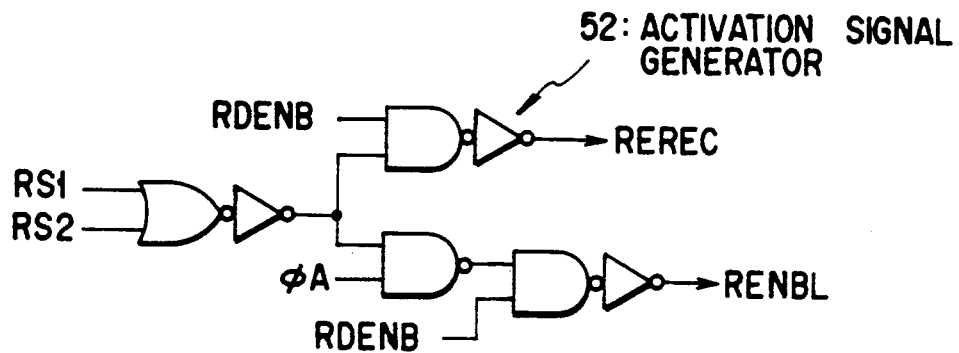
F I G. 11

NAND-CELL TYPE ELECTRICALLY ERASABLE AND PROGRAMMABLE READ-ONLY MEMORY WITH REDUNDANCY CIRCUIT

BACKGROUND OF THE INVENTION

1. Field of the Invention

The present invention relates generally to electrically erasable and programmable non-volatile semiconductor memory devices, and more particularly to an electrically erasable and programmable read only memory having an array of memory cells each of which essentially consists of one transistor. The invention also relates to a redundancy circuitry for use in electrically erasable and programmable non-volatile semiconductor memory devices.

2. Description of the Related Art

Recently, NAND-cell type EEPROMs have been developed as one of highly integrated electrically erasable and programmable read-only memory (EEPROM) devices. With the EEPROMs of this type, an array of rows and columns of memory cells is divided into a plurality of memory cell sections coupled to parallel bit lines on a semiconductor chip substrate. Each cell section includes a predetermined number of series-connected memory cell transistors that are connected in series to one another with each of "middle" semiconductive diffusion layers acting as the source and drain of adjacent ones of the memory cell transistors. Each memory cell transistor may be a floating-gate electron tunneling metal oxide semiconductor (FETMOS) field effect transistor having an insulated gate (floating gate) electrode for storing electrical charge carriers therein and a control gate electrode being coupled to a corresponding word line.

The NAND cell array is arranged either in a P type silicon substrate or in a P type well region formed in an N type silicon substrate. A memory cell transistor positioned at one end of each NAND cell section has a drain coupled to a corresponding bit line through a first switching MOS transistor known as the first "select" transistor. The source of another memory cell transistor that is positioned at the opposite end of the NAND cell section is coupled to a common source voltage (a reference potential wiring line) by way of a second select transistor. The control gate electrodes of NAND cell transistors are connected to one another along the row direction to constitute a plurality of parallel word lines over the substrate.

The operation of the conventional NAND-cell type EEPROM arranged as described above is as follows. A data write for a selected cell section is carried out in such a manner that the memory cell transistors included therein are sequentially subjected to a write operation with a certain memory cell transistor being as a write-starting cell transistor, the certain cell transistor being most distant from the memory cell transistor connected through the first select transistor to a corresponding bit line associated therewith (i.e., the memory cell transistor coupled to the common source potential through the second select transistor). A boosted high voltage Vpp (20 volts, for example) is applied to the control gate of a memory cell transistor being presently selected for write. An intermediate voltage VppM (such as 10 volts), which is a midway potential between a power supply voltage Vcc (5 volts, for example) and the ground potential, is applied to the gate of select transistor (select gate) and the control gate(s) of one or a plurality of non-selected memory cell transistors being positioned between the selected cell transistor and the first select transistor, thereby to render the non-selected cell transistors conductive. A zero-volt voltage or the intermediate voltage VppM is applied to the bit line in accordance with the logic value of a write data.

When the zero-volt voltage is applied to the bit line, a resultant potential thereon is transferred to the drain of the presently selected memory cell transistor through the intervening transistors being rendered conductive. Electrons are thus injected from the drain into the floating gate of the selected cell transistor. The threshold voltage of it is thus shifted positively. The positive shift condition may be defined as a logic "0" storage state. Alternatively, when the intermediate voltage VppM is applied to the bit line, the injection of electrons does not take place, so that the selected cell transistor is kept unchanged in its threshold voltage. This condition may be defined as a logic "1" storage state.

A data erase is carried out so that all the memory cell transistors included in the NAND-cell type EEPROM are erased at a time. More specifically, while the control gates are set at zero volts, (1) the bit lines and the common source line are rendered electrically floating, and (2) the high voltage Vpp is applied to the P type substrate (or both the P type well region and the N type substrate). As a result, electrons accumulated in the floating gates are released or "emitted" to the P type substrate (or to the P type well region) in all the memory cell transistors, causing their threshold voltages to be shifted negatively.

A data read is performed by detecting whether or not a current flows in a selected memory cell transistor while causing the control gate of selected cell transistor to be at zero volts, and applying the power supply voltage Vcc to the control gates of the remaining memory cell transistors and the select gates.

A significant problem of presently-available NAND-cell type EEPROMs is that, unlike the ordinary non-volatile semiconductor memory devices, it is not easy to cure or relieve a defective cell or cells, which are possibly occurred during the manufacturing process of the EEPROMs, by making use of a known redundancy circuitry. More specifically, it is not possible to replace a defective cell array of those memory cells containing a defective cell, which has been found in the final test of the manufacturing process and is coupled to a certain word line, with a corresponding one of subarrays of redundancy cells provided in advance on the same chip substrate by changing an electrical wiring connection therebetween, thereby to cure the defective cell array. The reason for this is described below.

According to presently available NAND-cell type EEPROMs, non-selected memory cell transistors have the specialty that they serve as the "transfer gates" for allowing a data bit to be transferred to or from a target cell transistor as selected during a write period or a read period. Due to such specialty, even if the defective cell subarray is replaced with a redundancy cell subarray with a word line being as a unit, it cannot be expected that a resultant NAND cell block will offer normal operations. Actually, in the art of NAND-cell EEPROMs, although a redundancy circuit scheme for curing defective memory cells has been long desired by the semiconductor manufacturers, nobody hears any successful achievement of such scheme until today.

This has been a serious bar to the improvement in the manufacturing yield of the NAND-cell EEPROMs.

SUMMARY OF THE INVENTION

It is therefore an object of the present invention to provide a new and improved electrically erasable and programmable semiconductor memory.

It is another object of the present invention to provide a new and improved NAND-cell type electrically erasable and programmable semiconductor memory which includes an internal redundancy circuitry for curing defective cells found therein and attains enhanced manufacturing efficiency.

In accordance with the above objects, the present invention is drawn to a specific electrically erasable and programmable semiconductor memory device, which comprises an array of memory cells arranged in rows and columns on a semiconductive substrate. Each of the memory cells includes a transistor having a charge storage layer insulatively arranged above the substrate and an insulated control gate electrode that overlies the charge storage layer and allows charge carriers to move to or from the charge storage layer. The array of memory cells is subdivided into a plurality of cell blocks. Each cell block includes a plurality of NAND cell sections, each of which includes a predetermined number of a series circuit of memory cell transistors. A plurality of parallel bit lines are connected to the NAND cell sections. A redundancy cell section is provided which includes an array of redundancy memory cells containing at least one spare cell block. A redundancy circuit is associated with the cell blocks, for replacing a defective block containing a defective memory cell or cells with the spare cell block.

The foregoing and other objects, features and advantages of the invention will become apparent from the following more particular description of preferred embodiments of the invention, as illustrated in the accompanying drawings.

BRIEF DESCRIPTION OF THE DRAWINGS

FIG. 1 is a diagram showing schematically the overall arrangement of a NAND-cell type electrically erasable and programmable read-only memory (EEPROM) in accordance with one preferred embodiment of the invention.

FIG. 4 is a diagram showing the overall configuration of internal memory cells of the cell array of FIG. 1.

FIG. 7 is a diagram showing a cell-block selection circuit arranged in the row decoder of FIG. 6.

FIG. 8 is a diagram showing a circuitry provided in the row redundancy circuit of FIG. 1 for determining the use of a redundancy cell block or blocks.

FIG. 9 is a diagram showing a circuitry arranged in the row redundancy circuit of FIG. 1 for storing the address of a defective cell block.

FIG. 10 is a diagram showing a logic circuit arranged in the row redundancy circuit of FIG. 1 for replacing a defective cell block with a selected one of the redundancy cell blocks.

FIG. 11 is a diagram showing an activation signal generating circuit included in the block selection circuit of FIG. 7.

DETAILED DESCRIPTION OF THE PREFERRED EMBODIMENTS

Figure 2A:
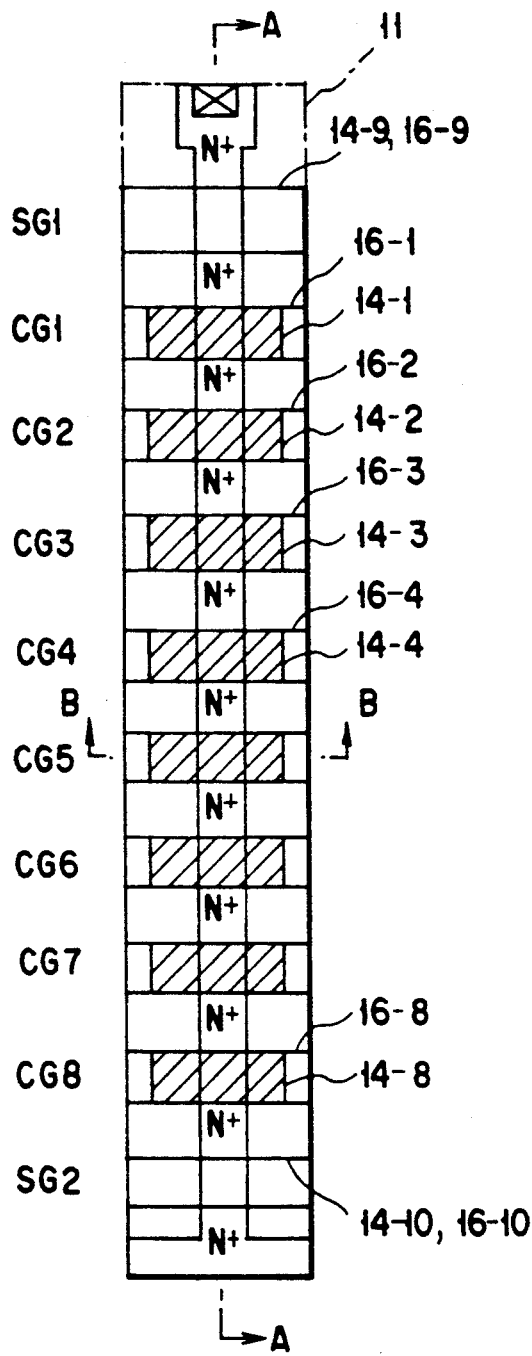
FIG. 2A shows a plan view of one NAND cell section included in a memory cell array of FIG. 1.

Referring now to FIG. 1, an electrically erasable and programmable read only memory (EEPROM) of the NAND cell type in accordance with one preferred embodiment of the present invention is generally designated by the numeral 20. The EEPROM 20 includes an array 21 of memory cells arranged in rows and columns. The memory cell array 21 is formed in a P type silicon substrate (as shown by the numeral 11 in FIGS. 3A and 3B). Memory cell array 21 may alternatively be arranged in a P type well region formed in an N type silicon substrate. Memory cell array 21 includes a subarray section of redundancy memory cells.

The memory cell array 21 is connected to a bit-line control circuit 26, which includes a sense amplifier circuit and a data latch circuit and which performs a write, a read, a rewrite and a verify operation for memory cell array 21. More specifically, the bit-line control circuit 26 essentially consists of a complementary metal oxide semiconductor (CMOS) flip-flop circuitry. Bit-line control circuit 26 is the circuit that carries out a latch operation for potentially latching a logic data to be written into a memory cell being presently selected, a sense operation for sensing a bit line potential to read a data, a sense operation for a verify-read after the write operation, and a latch operation for potentially latching a data to be rewritten (rewrite data) when any "insufficient write" is detected. Bit-line controller 26 is connected to a column decoder 27. Column decoder 27 is coupled to an address buffer 28. Address buffer 28 supplies column decoder 27 with an address signal. Address buffer 28 is also connected through a word-line controller 23 to a row decoder 22, which is coupled to control gate lines (word lines) and select gate lines of memory cell array 21 and which potentially controls these lines. Wordline controller 23 supplies one of the control gate lines being selected by row decoder 22 with a suitable control signal for the execution of a data write, an erase, a read and a verify operation.

The bit-line control circuit 26 is connected to a data input/output (I/O) buffer 25, and receives the output of the column decoder 27, which is responsive to an address signal supplied by address buffer 28. Memory cell array 21 is coupled to a substrate-potential control circuit 24, which potentially controls the P type silicon substrate (or the P type well region in the N type silicon substrate) in such a manner that the substrate (or the P type well region in which the memory cells are formed) is normally at zero volts and that it is at a boosted high-level voltage Vpp (=20 volts) during the erase period.

The address buffer 28 is also connected to two redundancy circuits 29, 30 in addition to the row decoder 22 and the word-line controller 23. The first redundancy circuit 29 is a row redundancy circuit, which is coupled to row decoder 22 that is associated with the rows of memory cells M in the memory cell array 21. The second redundancy circuit 30 is a column redundancy circuit, which is associated with the column decoder 27. An input address is transmitted through address buffer 28 to row decoder 22, column decoder 27, row redundancy circuit 29 and column redundancy circuit 30. The outputs of these redundancy circuits 29, 30 are supplied to row decoder 22 and column decoder 27, respectively.

Figure 2B:
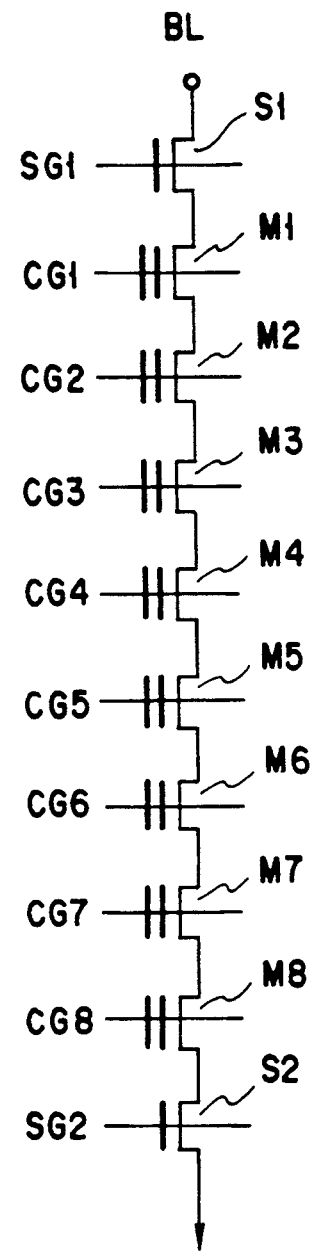
FIG. 2B is a diagram showing the equivalent circuit of the NAND cell section of the preceding figure.

The memory cell array 21 of FIG. 1 is divided into a plurality of cell sections, each of which includes a predetermined number of floating gate electron tunneling metal oxide semiconductor (FETMOS) field effect transistors M each constituting one "cell." In the embodiment, these "memory cell transistors" are assumed for purposes of explanation to be eight FETMOS transistors M1, M2, M3,..., M8. As shown in FIG. 2B, the memory cell transistors M are connected in series with one another in such a manner that each of "middle" semiconductive impurity-doped diffusion regions serves both as a drain of a cell transistor and as a source of another cell transistor neighboring thereto, thereby providing a "NAND cell" structure. The cell section of FIG. 2A will be referred to as a "NAND cell section" hereinafter. The two different cross-sectional structures of the NAND cell section are shown in FIGS. 3A and 3B, respectively.

Figure 3A:
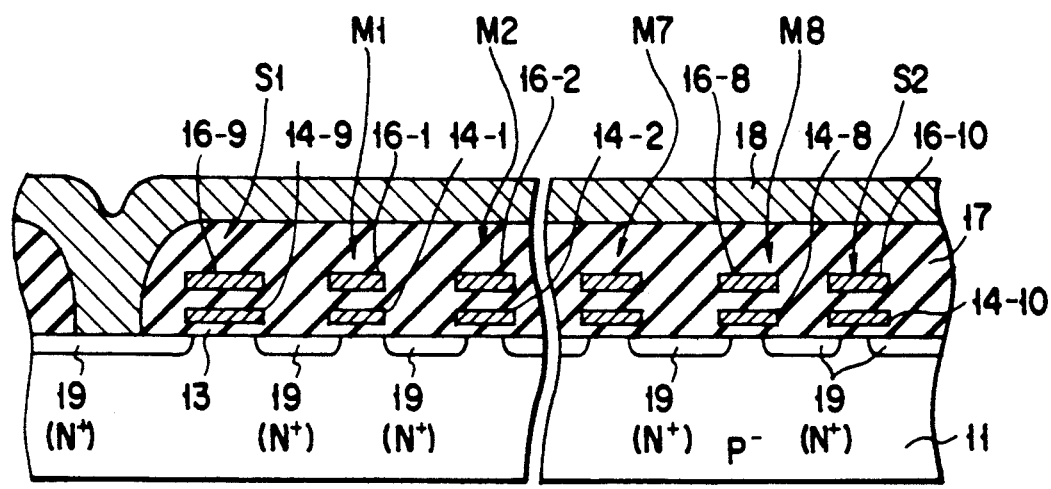
FIGS. 3A and 3B illustrate two cross-sectional structures of the NAND cell section of FIGS. 2A and 2B along two intersecting lines A—A' and B—B' respectively.
Figure 3B:
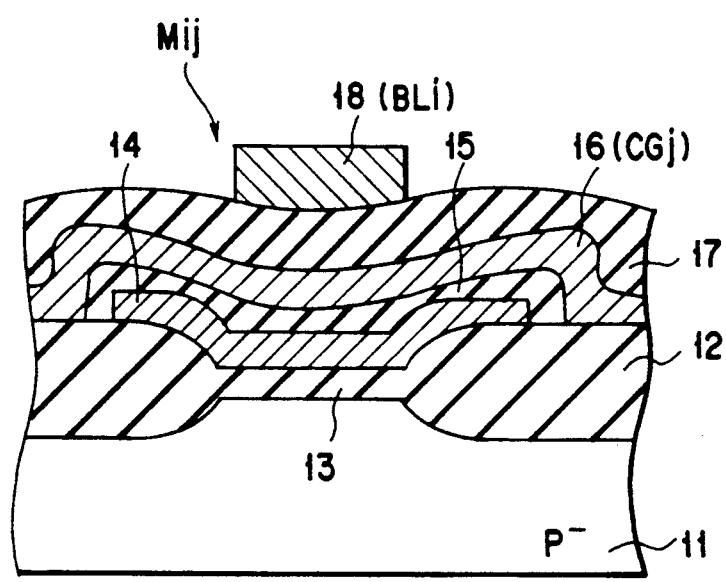

As shown in FIGS. 3A and 3B, the series circuit of memory cell transistors M1 to M8 is formed in the top surface of P type substrate 11 (or P type well region not shown), which is surrounded by an element-separation oxide film 12. Memory cell transistors M1-M8 have (1) floating gate electrodes 14-1, 14-2,..., 14-8 being electrically insulated by a dielectric film (gate insulation film) 13 from substrate 11, and (2) control gate electrodes 16-1, 16-2,..., 16-8 insulated by another dielectric film 15. Heavily-doped N (N+) type diffusion layers 19 are formed in the top surface of substrate 11 as the sources or drains of memory cell transistors M. Each of middle diffusion regions, except for the outer diffusion regions being positioned at the both ends of the series-connected NAND cells, serves as the source and drain of adjacent memory cell transistors.

On the drain side of the series array of NAND cells, a first select transistor S1 is arranged which has two stacked gate layers 14-9, 16-9 being electrically coupled together. A second select transistor S2 is provided on the source side of the NAND cell array to have gate layers 14-10, 16-10 that are electrically coupled with each other. Memory cell transistors M and the first and second select transistors S1, S2 are covered by a CVD dielectric film 17, on which a metallic wiring layer 18 is disposed to constitute a bit line BLi (i=0, 1, 2,...). As shown in FIG. 3A, bit line layer 18 is coupled, through a contact hole formed in CVD dielectric film 17, to one diffusion layer 19 acting as one (drain) of the current-carrying electrodes of first select transistor S1.

The control gate electrodes 16 of memory cell transistors M along the column direction are connected together to provide an elongate control gate wiring layer CGj (j=1, 2,..., 8) shown in FIG. 3B. The resultant parallel control gate wiring layers CG1, CG2,..., CG8 constitute word lines of the EEPROM 20. Similarly, the mutually-connected select gates 14-9, 16-9 of the first select transistor S1 constitute a select gate line that extends in the row direction; the mutually-connected select gates 14-10, 16-10 of the second select transistor S2 constitute another select gate line extending in the row direction.

The overall arrangement of the memory cell array section 21 including a plurality of similar NAND cell sections is illustrated in FIG. 4, wherein "Vs" is used to designate a common source potential of the EEPROM 20. The memory cell transistors M that are coupled to eight control gate lines (word lines) CG1, CG2,..., CG8 being positioned between the first and second select gate lines SG1, SG2 constitute one cell block, which will be referred to as a "NAND cell block" in the rest of the description.

Figure 5:
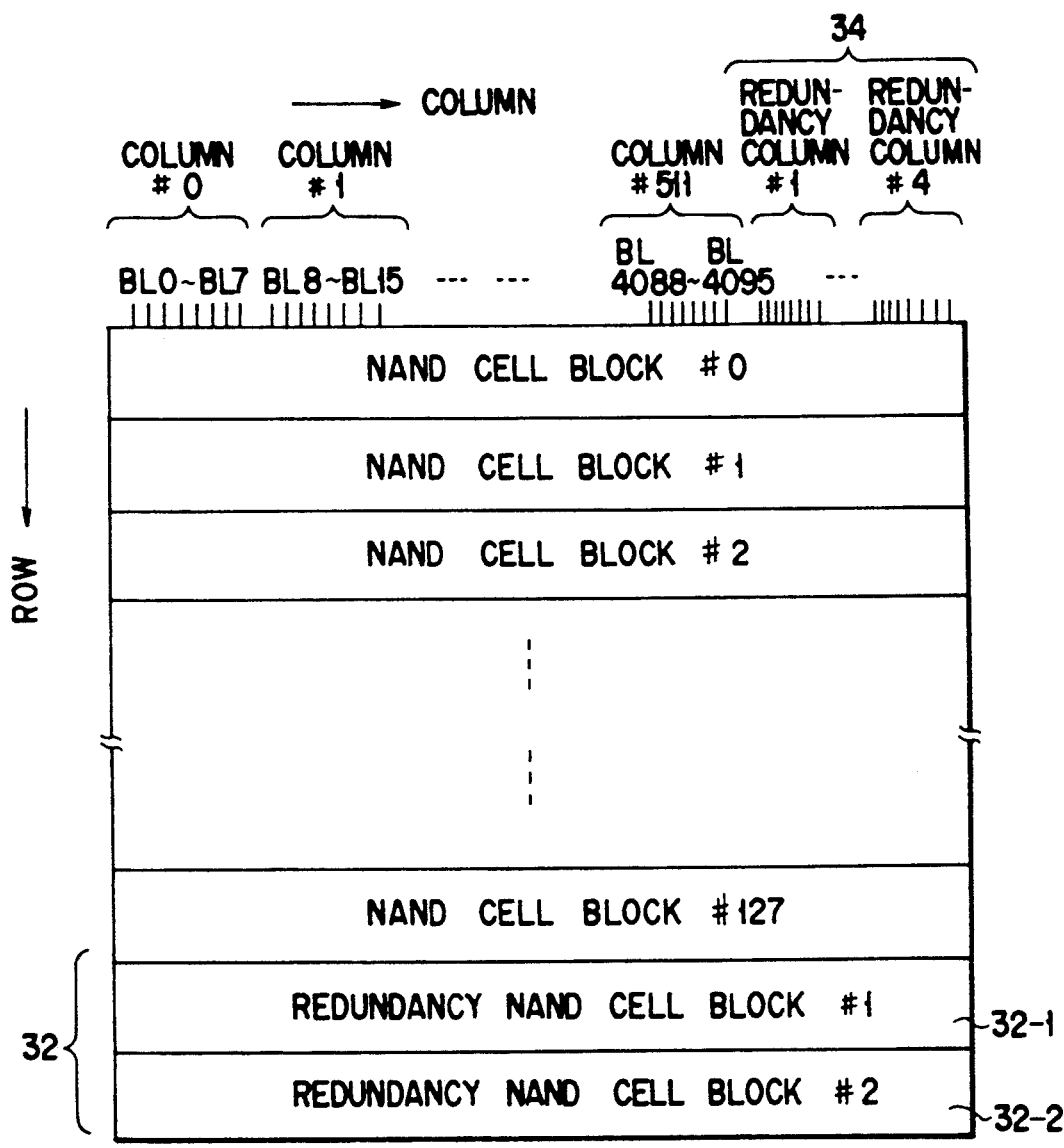
FIG. 5 is a diagram showing the circuit configuration of a plurality of internal memory cell blocks including the redundancy cell section of FIG. 1.

Turning to FIG. 5, there is shown the cell block structure of the memory cell array 21 in a case where the invention is applied to a 4M-bit NAND-cell type EEPROM. This 4M-bit memory cell array 21 is basically subdivided into one hundred and twenty eight (128) NAND cell blocks, each of which has the capacity of 32 kilobits. With the NAND-cell type EEPROM in accordance with the embodiment of the invention, two redundancy NAND-cell blocks 32-1, 32-2 are provided in addition to the aforementioned basic memory cell arrangement. Each column includes eight bit lines BL, each of which corresponds to input/output (I/O) lines IO-0, IO-1, IO-2,..., IO-7, to provide five hundreds and twelve (512) columns of column numbers 0, 1,..., 511. A redundancy column section 34 is added to these basic columns. Redundancy column section 34 includes four spare columns (32-bit lines) of column numbers 1, 2, 3, 4, as shown in FIG. 5.

Figure 6:
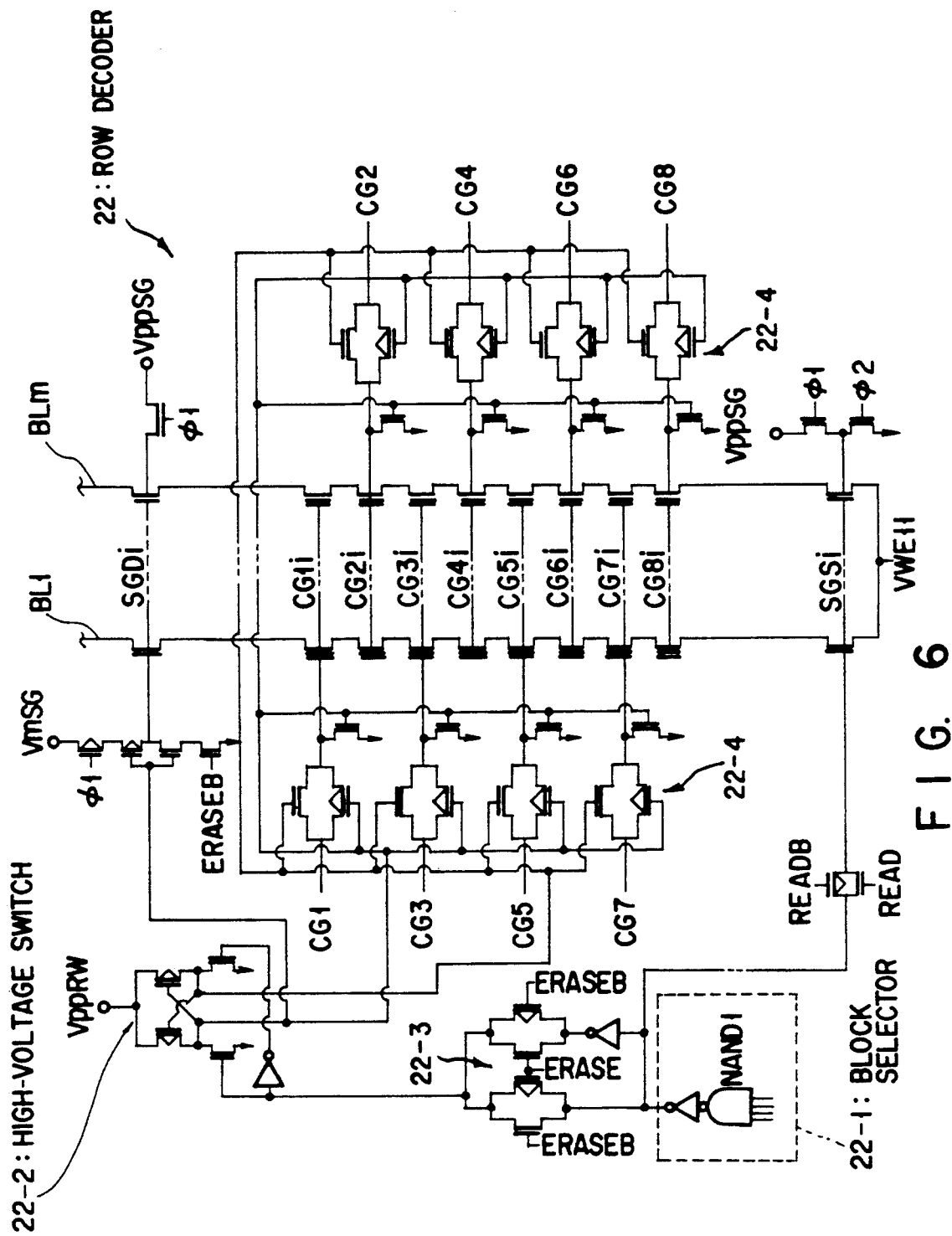
FIG. 6 is a diagram showing the internal circuit configuration of the row decoder shown in FIG. 1.

The detailed circuit configuration of the row decoder 22 of FIG. 1 is shown in FIG. 6, wherein one NAND-cell block is selected by a block selector circuit 22-1. The circuit configuration of block selector 22-1 for a redundancy cell block and that for a non-redundancy cell block are shown in FIG. 7. One non-redundancy cell block is selected from the NAND-cell blocks in response to an address signal (A12, A13,..., A18) and an activation signal RENBL. One redundancy cell block is selected in response to a redundancy block address signal RSk (k=1, 2) and an activation signal REREC as shown in FIG. 7.

In the row decoder circuit 22 of FIG. 6, the output of the block selector 22-1 is coupled to a high-voltage switch circuit 22-2 by way of transfer gates 22-3, each of which consists of an enhancement-type (E-type) N-channel metal oxide semiconductor (MOS field effect transistor and an E-type P-channel MOS transistor. The transfer path may be suitably selected in response to a control signal ERASE, ERASEB in accordance with a read, a write, and an erase operation being executed. The output of high-voltage switch 22-2 is used to supply the output signals (CG1, CG2,..., CG8) of the control-gate controller (word-line controller) circuit 23 to control gate lines CG1i, CG2i,..., CG8i through corresponding transfer gates 22-4 associated therewith. The output of high-voltage switch 22-2 is also used to supply the control gate lines with a ground potential Vss by causing the transfer gates 22-4 to turn off.

The operation of the row decoder 22 of FIG. 6 is as follows. When the NAND-cell EEPROM 20 is set in a data-read mode, the erase signal ERASE is at a "low" (L) level. A certain memory cell block is selected by the block selector 22-1; the drain-side select gate line SGD and the source-side select gate line SGS of the cell block are charged toward the power supply voltage Vcc. Thereafter, the turn-on/off states of the transfer gates 22-4 are controlled so that a selected control gate is at zero volts, while the remaining non-selected control gates are at the power supply voltage Vcc. In a verify-read period, the selected control gate is forced to be set at approximately 0.5 volts.

In a case of data-write operation, the erase signal ERASE is at the "L" level, and other erase signal ERASEB goes high to have a high (H) level. In a selected cell block, its drain-side select gate line SGD is at an intermediate potential Vm (approximately 10 volts), and its source-side select gate line SGS is at zero volts. At this time, a selected control gate line (selected word line) of the cell block is applied with the high-level voltage Vpp, while non-selected control gate lines thereof are at the intermediate voltage Vm.

In the case of a data-erase operation, the erase signal ERASE goes high, and erase signal ERASEB drops to the "L" level. As a result, the control gate lines of the selected cell block is at the ground potential Vss, whereas those of the non-selected cell blocks are charged up to the power supply voltage Vpp. All the select gate lines SGD, SGS of the selected and non-selected cell blocks are precharged to a specific voltage Vpp-Vth, where "Vth" is the threshold voltage of memory cell transistor.

A row-cure or remedy technique for the NAND-cell EEPROM 20 thus arranged as described above is as follows. With the embodiment, the cure of a defective cell(s) is attained by employing a fuse system with a plurality of fuse members, which are provided in correspondence with the address of the redundancy NAND-cell blocks 32-1, 32-2, and each of which is melt to cut off the electrical circuit wiring path between related circuit components in a corresponding redundancy cell block.

The internal circuit configuration of the row redundancy circuit 29 of FIG. 1 is illustrated in FIGS. 8 to 11. The circuitry shown in FIG. 8 is a redundancy-block use control circuit 40, which determines whether or not the redundancy cell block section 32 is to be used. A reset signal RESET for resetting the circuit 40 is a pulse signal that is generated when the power supply is turned on. When the use of the redundancy cell blocks is not required, a fuse 42 of FIG. 8 is not cut off. Under such a condition, a circuit node N1 is coupled to the ground potential. When the power supply is turned on, an output signal SPRBk of circuit 40 goes high.

When it is required to use the redundancy NAND-cell block section 32, the fuse 42 of FIG. 8 is cut off. When the power supply is turned on after the cut off of fuse 42, the node N1 potentially rises at the "H" level, due to the existence of a capacitance-coupling between circuit nodes N1, N2, in response to the reset signal RESET. Node N2 drops down to the "L" level, causing signal SPRBk to be at the "L" level. Assume that a redundancy NAND-cell block #1 (32-1) of the two redundancy blocks 32-1, 32-2 shown in FIG. 5, for purposes of explanation. In this case, the fuse 42 is cut off, causing signal SPRBK to drop to the "L" level.

The circuitry shown in FIG. 9 is a defective block address latch circuit 44, which latches and stores therein the address of a defective NAND-cell block. Address latch circuit 44 includes a plurality of fuse members 46 arranged corresponding to the addresses of NAND-cell blocks, one of which is shown in FIG. 9 with respect to a corresponding block address. Address latch 44 also includes transfer gate circuits 47, 48, each of which consists of two MOS transistors. The embodiment is arranged such that only fuses corresponding to those of the defective block addresses, which correspond to the addresses being at the "L" level, are cut off. By way of example, assume that defective block addresses A12, A13, A14, A15, A16, A17, A18 are at 0, 0, 1, 1, 1, 1, 1, respectively. When these addresses are replaced with a redundancy cell block #1 (32-1), the fuses 46 of circuits which generate signals ASPR12B1, ASPR13B1 are cut off.

In this case, a circuit node N3 of FIG. 9 potentially rises to the "H" level. A circuit node N4 drops to the "L" level, while a node N5 goes high, causing the transfer gate circuit 47 coupled to AiB to turn on. When the aforementioned defective address is input, the signal ASPR12B1 becomes at the "L" level, since A12 is at the "L" level and A12B is at the "H" level. Similarly, the signal ASPR13B1 is also at the "L" level. At this time, the remaining signals ASPRiB1 (i=14, 15, 16, 17, 18) are held at the "L" level, since the transfer gate circuit 48 turns on and Ai is at the "H" level.

The circuitry shown in FIG. 10 is a logic circuit 50 that provides a logic result between the output signal ASPRiB1 of the defective block address latch circuit 44 and the output signal SPRB1 of the redundancy-block use controller 40. A signal $\phi A$ is normally at the "H" level; this signal is at the "L" level only during a "block erase" period, wherein all the memory cells are erased at a time. Therefore, when the above mentioned defective address is input, an output signal RS1 is at the "H" level. When an address other than the above address is input, a corresponding one of the signals ASPRiB1 (i=14, 15, 16, 17, 18) comes to have the "H" level, so that the signal RS1 is set at the "L" level. In a case where it is not required to cut off any fuse 46 of FIG. 9, when an address pattern "1, 1, 1, 1, 1, 1, 1" is input, any one of the signals ASPRiB1 drops to the "L" level. At this time, RSk is at the "L" level, since the signal SPRBk is at the "H" level.

The circuitry shown in FIG. 11 is an activation signal generator 52 for the block selector described previously. When a defective address is input, the output signal RS1 of the block-replace logic circuit 50 of FIG. 10 goes high, causing an activation signal REREC to become at the "H" level to select corresponding redundancy NAND-cell block. When another address other than the above address is input, an activation signal RENBL goes high in accordance with a signal RDENB, thereby to select a non-redundancy NAND-cell block.

Figure 12:
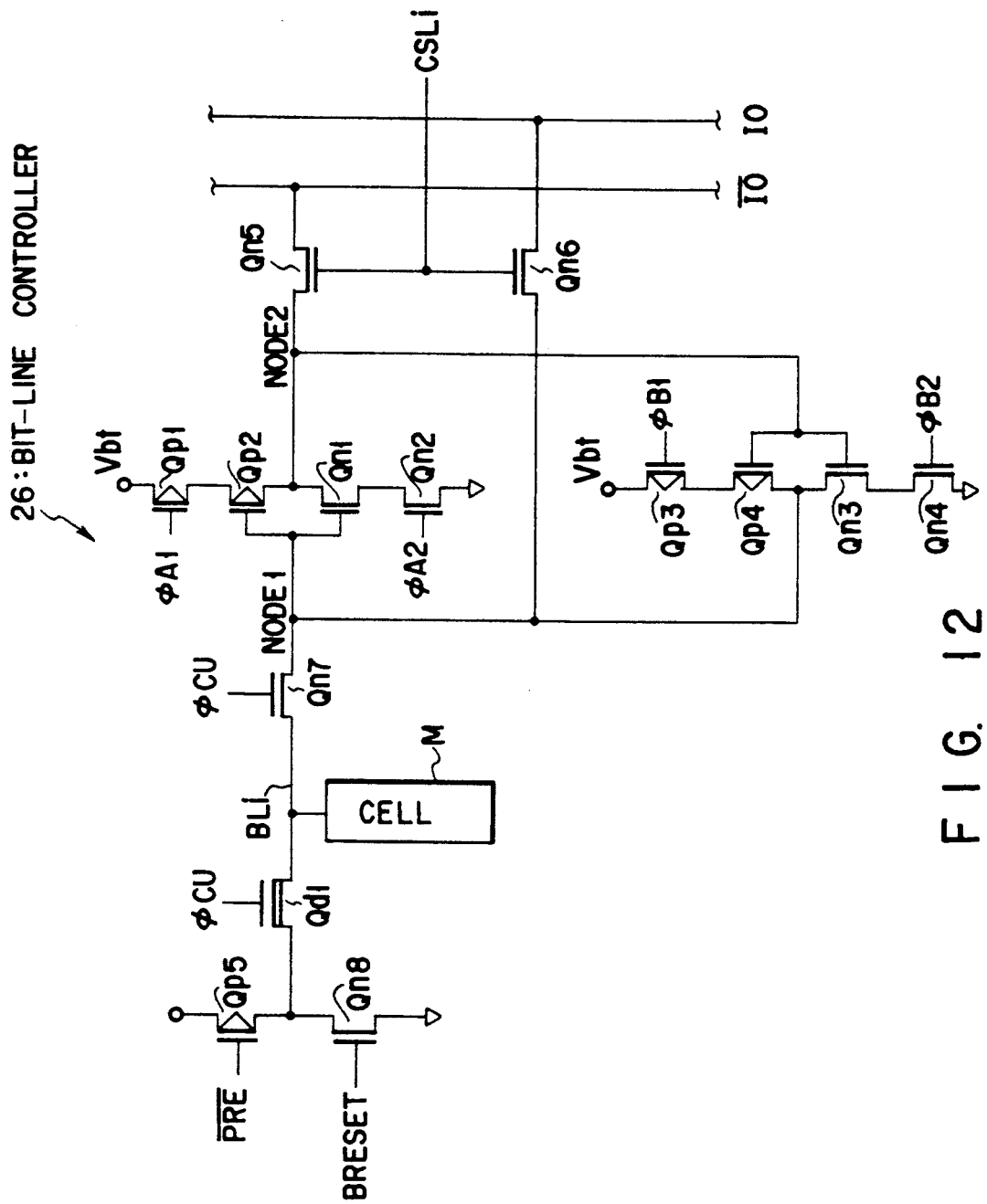
FIG. 12 is a diagram showing the internal arrangement of the bit-line control circuit shown in FIG. 1.
Figure 13:
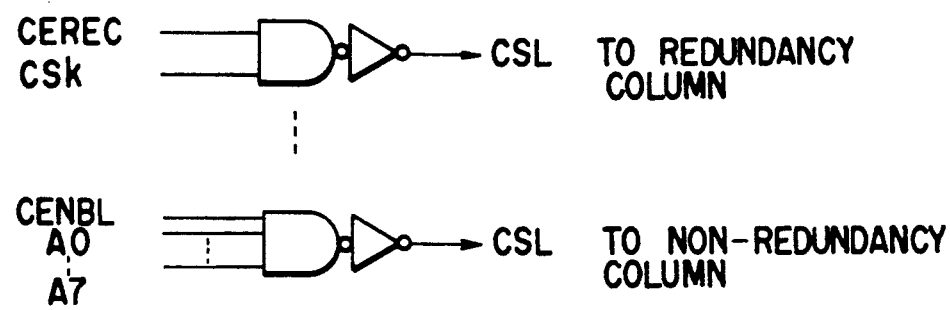
FIG. 13 is a diagram showing a circuitry for determining the use of the column redundancy circuit of FIG. 1.
Figure 14:
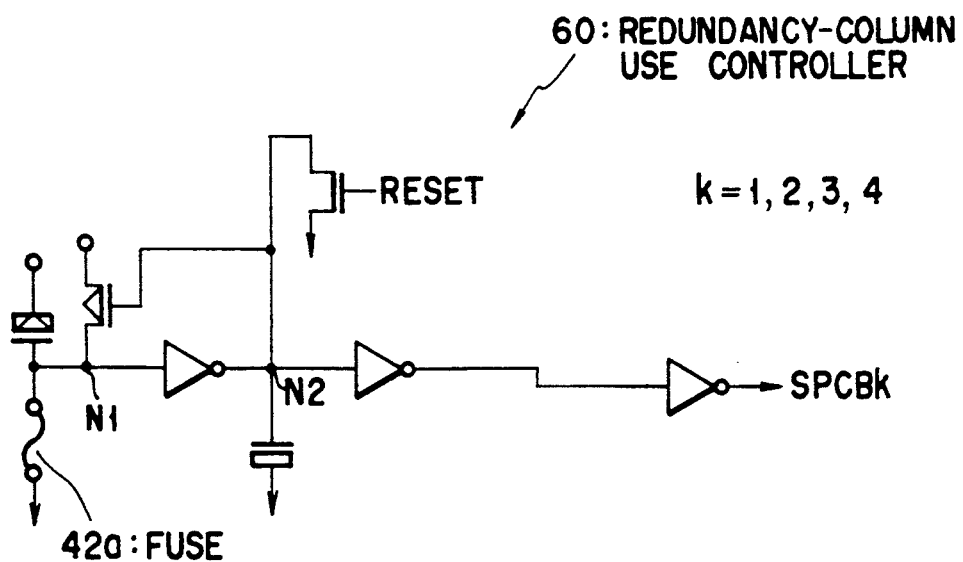
FIG. 14 is a diagram showing a column redundancy circuit.

The following is an explanation of how a column curing method is executed with reference to FIG. 12, which shows the detailed arrangement of the bit-line controller 26 of FIG. 1. Bit-line controller 26 includes a sense-amplifier/data-latch circuit, which may be a complementary MOS (CMOS) flip-flop circuit consisting of E-type P-channel MOS transistors Qp1, Qp2, Qp3, Qp4 and E-type N-channel MOS transistors Qn1, Qn2, Qn3, Qn4. MOS transistors Qp1, Qp3 have first current-carrying electrodes for receiving a control voltage signal Vbt. E-type N-channel MOS transistors Qn5, Qn6 are connected to nodes NODE1, NODE2 and input/output lines IO, $\overline{IO}$. MOS transistors Qn5, Qn6 have gate electrodes coupled to a corresponding column select line CSLi. These transistors Qn5, Qn6 may turn on or off selectively in response to a column select signal CSLi, which is selected by an input address. Transistors Qn5, Qn6 constitute a transfer gate for controlling the transfer of a data between the CMOS flip-flop circuit and I/O lines IO, $\overline{IO}$. If one address consists of eight bits, the column select signal CSLi is a common signal with respect to eight bit lines BL.

An E-type N-channel MOS transistor Qn7 is coupled between the node NODE1 and a corresponding bit line BLi associated with the sense-amplifier/data-latch circuit (CMOS flip-flop). Transistor Qn7 is provided as a transfer gate for allowing a data to be selectively transferred between the bit line BLi and sense-amplifier/-latch circuit. During a read period, a clock signal $\phi CD$, which is supplied to the gate of transistor Qn7, is at the "H" level. Clock signal $\phi CD$ will be at the intermediate potential Vm during a write period. In responding to clock $\phi CD$, transistor Qn7 turns on, permitting a data to be transferred between bit line BLi and sense/latch circuit. An E-type P-channel MOS transistor Qp5 is coupled to bit line BLi through a depression-type (D-type) MOS transistor Qd1. Transistor Qp5 is a precharging device for precharging bit line Bli. The gate electrode of transistor Qp5 is coupled to a precharge control signal $\overline{PRE}$. When signal $\overline{PRE}$ drops to the "L" level, the precharging transistor Qp5 is rendered conductive causing bit line BLi to be precharged to the power supply voltage Vcc (=5 volts in this embodiment).

As shown in FIG. 12, an E-type N-channel MOS transistor Qn8 is connected to the MOS transistors Qp5, Qd1. Transistor Qn8 is provided as a resetting device. Transistor Qn8 has a gate electrode being coupled to a reset control signal BRESET. When signal BRESET goes high, transistor Qn8 turns on causing bit line BLi to be reset to the ground potential. The D-type N-channel MOS transistor Qd1 is provided to prevent transistors Qp5, Qn8 from being applied with a high voltage during an erase period, during which the high voltage is applied to the memory cells. A clock signal $\phi CU$, which is supplied to the gate of transistor Qd1, drops to the "L" level causing transistor Qd1 to turn off. This prevents the high voltage from being applied undesirably to MOS transistors Qp5, Qn8.

The bit-line controller 26 of FIG. 12 operates as follows. During a read period, clock signals $\phi A1$, $\phi B1$, which are supplied to the gate electrodes of MOS transistors Qp1, Qp3 included in the sense/latch circuit (CMOS flip-flop), are at the "H" level. Clock signals $\phi A2$, $\phi B2$, which are supplied to the gate electrodes of MOS transistors Qp2, Qn4 of the CMOS flip flop circuit, are at the "L" level. The CMOS flip-flop is thus rendered inoperative. At this time, column select signal CSLi is at the "L" level. Clock signals $\phi CD$, $\phi CU$ and precharge control signal $\overline{PRE}$ are at the "H" level, while the reset signal BRESET is at the "L" level. The voltage Vbt being applied to transistors Qp1, Qp3 is potentially equivalent to the power supply voltage Vcc.

When control signal $\overline{PRE}$ drops at the "L" level, the bit line BLi is precharged to the power supply voltage Vcc. Thereafter, control signal $\overline{PRE}$ goes high toward the "H" level, causing bit line BLi to be in the electrically floating condition. A predetermined potential is then applied to a word line coupled to a selected memory cell, so that a data is read out of the selected cell. The resultant potential on bit line BLi may change to either the "H" or the "L" level depending on the logic value of the read data.

By forcing the clock signal $\phi A1$ to be at the "L" level and clock signal $\phi A2$ to be at the "H" level, the potential at the circuit node NODE2 of FIG. 12 is fixed at a specific level in accordance with the bit-line potential. Subsequently, the clock signal $\phi B1$ is at the "L" level and clock signal $\phi B2$ is at the "H" level, causing the read data to be latched in the CMOS flip-flop circuit. The column select signal CSLi then rises to the "H" level, causing the data to be transferred from the CMOS flip-flop to the I/O lines IO, $\overline{IO}$.

When the NAND-cell EEPROM is set in a write mode, the clock signals $\phi A1$, $\phi B1$ drop to the "L" level, and clock signals $\phi A2$, $\phi B2$ rise to the "H" level, causing logic "0" is written by injecting charge carriers into the floating gate of a selected memory cell transistor, the I/O line IO is at the "H" level, while the other I/O line $\overline{IO}$ is at the "L" level, with the column select signal CSLi being set at the "H" level. Alternatively, when a logic "1" is written by preventing charge carriers from injecting into the floating gate of the selected memory cell transistor, the I/O line IO is at the "L" level, while the I/O line $\overline{IO}$ is at the "H" level, with column select signal CSLi being at the "H" level. The above voltage-setting operation will be repeated with respect to one page, which covers from a column address #0 to column address #511.

After a data set of one page is latched, the clock signal $\phi CD$ rises at the "H" level. Clock signal $\phi CD$ and control voltage Vbt are changed from the power supply voltage Vcc to the intermediate voltage Vm. A resultant potential on bit-line BLi becomes at either Vm or 0 depending on the logic value of the write data. After the completion of the write operation, signals $\phi CD$, Vbt are at Vcc, signals $\phi A1$, $\phi B1$ are at the "H" level, and signals $\phi A2$, $\phi B2$ are at the "L" level. The signal BRESET is at the "H" level to reset the circuit.

Figure 15:
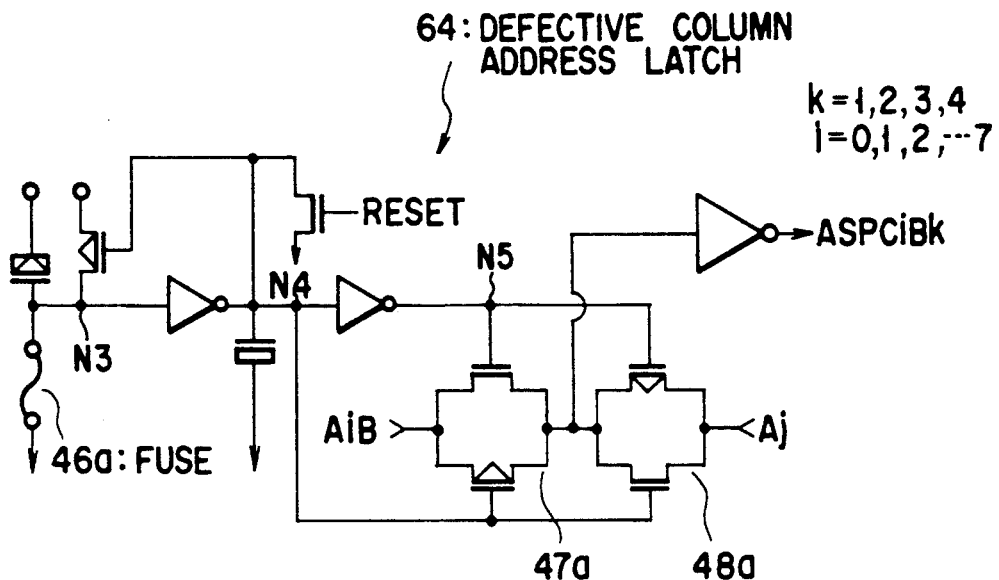
FIG. 15 is a diagram showing a circuitry provided in the column redundancy circuit of FIG. 1 for storing the address of a defective column.
Figure 16:
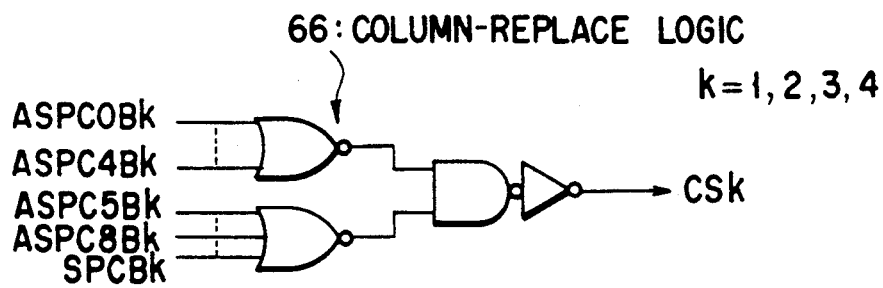
FIG. 16 is a diagram showing a logic circuit arranged in the column redundancy circuit of FIG. 1 for replacing a defective column with a selected one of the redundancy columns.

A column-cure technique for the NAND-cell EEPROM thus arranged as described above is as follows. FIGS. 13 through 17 show several internal circuits provided in the column redundancy circuit 30 of FIG. 1, the circuit configurations and operations of which are essentially similar to those of the row redundancy circuit shown in FIGS. 7 to 11. For purposes of explanation, assume that it is required to use a redundancy column #1 in the redundancy columns #1 to #4 of the redundancy column section 34 of FIG. 5. In such case, a fuse 42a which is included in a redundancy-column use controller 60 that generates a signal SPCB1 is cut off. Thus, the signal SPCB1 drops to the "L" level after the power is turned on. A fuse 46a of a defective column address storage latch circuit 64 shown in FIG. 15 which fuse corresponds to a specific address being at "L" level in the defective column addresses, is then cut off. Therefore, when a defective address is input, all the output signals ASPCi of the latch circuit 64 of FIG. 15 are at the "L" level. In responding to the potential change of these signals, an output signal CS1 of a column replace logic circuit 66 of FIG. 16 rises to the "H" level.

Figure 17:
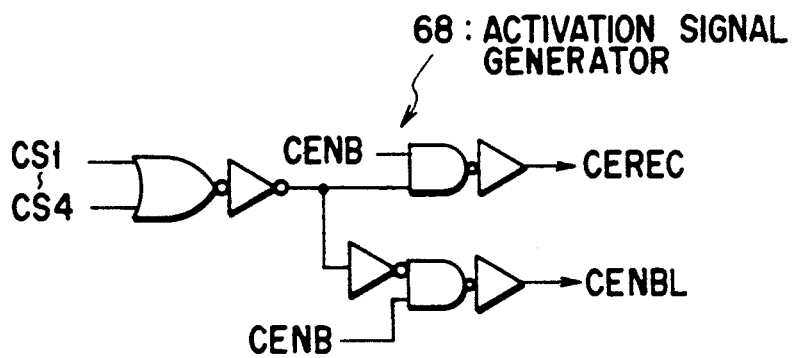
FIG. 17 is a diagram showing an activation signal generating circuit included in the column selection circuit of FIG. 14.

An activation signal generator circuit 68 shown in FIG. 17, which is similar in circuit configuration to the activation signal generator 52 of FIG. 11, generates a column gate activation signal CEREC that rises to the "H" level in response to the activation signal CENB when a defective address is input. When an address other than the defective address is input, another column gate activation signal CENBL is at the "H" level in response to the activation signal CENB.

A description will now be given of a means for improving the performance and reliability of the column cure operation. Imagine that a leakage of current is taking place at a certain bit line, which is one case leading to the occurrence of a defective column. Such bit-line leakage results in an erroneous read being occurred in a read mode due to the leakage of a precharge voltage therefor. The bit-line leakage will exhibit a bad behavior even after the defective address is replaced with one of the redundancy addresses.

During a write period, each bit line BLi is supplied with a predetermined voltage after a data is latched. At this time, it is no longer possible to control, by supplying a data externally, the latch condition of the nodes NODE1, NODE2 in the CMOS flip-flop circuit of FIG. 12, which constitutes the sense-amplifier/latch circuit for the bit-line controller 26. The impossibility of such latch-state control is due to the fact that, since the defective column is already replaced with a redundancy column, the column select signal CSL of a bit line associated with the defective column will not be at the "H" level even if an address is input thereto. In such a case, only a column select signal CSL of the redundancy column will rises to the "H" level.

Assume that the latch node NODE1 is at the "H" level and the latch node NODE2 is at the "L" level (a logic "1" write state) of the CMOS flip-flop circuit of FIG. 12 with respect to a bit line at the defective address. Under such a condition, it cannot eliminate that a current leaks from the intermediate potential Vm through the bit line after the voltage Vbt rises from the power supply voltage Vcc to the intermediate voltage Vm. The intermediate voltage Vm is the output voltage of a potential booster circuit; therefore, if such current leakage is greater in magnitude, the booster output voltage will possibly decrease in potential. Since the intermediate voltage Vm is common with respect to all the bit lines, the decrease in the booster output voltage leads to a decrease in the bit line potential level of a normal (non-defective) address. This results in that an erroneous read takes place. To eliminate such erroneous read, it should be required that the latch nodes NODE1, NODE2 are at the "L" and "H" levels respectively with respect to the defective bit line.

According to the present embodiment, before a page data is input in a write mode, the latch nodes NODE1, NODE2 of all the bit lines are forcibly reset such that NODE1 is at "L" level and NODE2 is at "H" level. To attain the reset operation, the bit-line reset signal BRESET is set at the "H" level, while the clock signal $\phi$A2 is at "H" and clock signal $\phi$B1 is at "L" once after clock signals $\phi$A1, $\phi$A2 are at "L" and clock signals $\phi$B1, $\phi$B2 are at "H" level. Thereafter, reset signal BRESET drops at "L" level; the input of the page data is then initiated. With such an arrangement it becomes possible to eliminate that a current leakage degrades the operation reliability of the NAND-cell type EEPROM in a write mode of it.

The present invention is not limited to the above-described specific embodiments and may be practiced or embodied in still other ways without departing from the spirit or essential character thereof.

What is claimed is:

1. An electrically erasable and programmable nonvolatile semiconductor memory device comprising:
   a semiconductive substrate;
   an array of rows and columns of memory cells on said substrate, each of said memory cells including a transistor having a charge storage layer insulatively arranged above said substrate and an insulated control gate electrode overlying said charge storage layer and allowing charge carriers to move to or from said charge storage layer;
   said array of memory cells being divided into a plurality of blocks, each of which includes a plurality of NAND cell sections each including a predetermined number of a series circuit of memory cell transistors;
   a plurality of bit lines connected to said NAND cell sections;
   a redundancy cell section including an array of redundancy memory cells containing at least one spare cell block; and
   redundancy circuit means associated with said cell blocks, for replacing a defective block containing a defective memory cell or cells with the spare cell block.

2. The memory device according to claim 1, wherein said spare cell block includes a plurality of NAND cell sections, each of which includes a predetermined number of a series circuit of memory cell transistors.

3. The memory device according to claim 2, wherein said redundancy cell section includes a plurality of spare cell blocks.

4. The memory device according to claim 3, wherein said redundancy circuit means comprises:
   address storage circuit means for holding an address of the defective block;
   logic circuit means being responsive to said address storage circuit means, for determining a replacement of the defective block with the spare block; and
   signal generator circuit means for providing said logic circuit means with an activation signal.

5. The memory device according to claim 2, further comprising:
   a first switching transistor arranged between one end of each NAND cell section and a corresponding bit line; and
   a second switching transistor coupled between an opposite end of each NAND cell section and a common source potential.

6. The memory device according to claim 2, further comprising:
   redundancy column section adjacent to the columns of said memory cell array on said substrate and including at least one spare column; and
   column redundancy circuit means for replacing a defective column found in said columns of said memory cell array with said spare column.

7. The memory device according to claim 6, wherein said redundancy column section includes a plurality of spare columns.

8. The memory device according to claim 7, wherein said column redundancy circuit means comprises:
- column-address storage circuit means for storing an address of the defective column;
- column replacement logic circuit means being responsive to said column-address storage circuit means, for determining a replacement of the defective column with the spare column; and
- signal generation circuit means for providing said column replacement logic circuit means with an activation signal.

9. An electrically erasable and programmable read only memory system comprising:
- an array of memory cells arranged in rows and columns, each of said memory cells including a transistor having an insulated charge-storage layer and a control gate electrode insulatively overlying the charge-storage layer, said control gate electrode controlling electrical charge carriers to move to or from said charge-storage layer so as to charge or discharge said charge-storage layer;
- the memory cell array being subdivided into a plurality of cell blocks each of which includes a plurality of NAND cell sections each including a predetermined number of series-connected memory cell transistors;
- a redundancy cell array including at least one spare cell block; and
- row redundancy circuit means connected to said cell blocks, for replacing a defective cell block containing a defective memory cell with said spare cell block.

10. The memory system according to claim 9, wherein said spare cell block includes a plurality of NAND cell sections each of which includes series-connected memory cell transistors corresponding in number to those in each row of said memory cell array.

11. The memory system according to claim 10, further comprising:
- a first select transistor between a first end of each NAND cell section and a corresponding bit line associated therewith; and
- a second select transistor between a second end of said each NAND cell section and a common source voltage of said memory system.

12. The memory system according to claim 11, wherein said memory cell transistors include floating gate electron tunneling metal oxide semiconductor field effect transistors, which have control gates being coupled to a plurality of parallel word lines.

13. The memory system according to claim 12, wherein the first and second select transistors include metal oxide semiconductor field effect transistors.

14. The memory system according to claim 13, wherein said row redundancy circuit means comprises:
- address storage means for storing therein an address of the defective cell block;
- logic circuit means being responsive to said address storage means, for providing a command for replacement of the defective cell block with the spare cell block; and
- signal generator means for supplying an activation signal to said logic circuit means.

15. The memory system according to claim 14, wherein said row redundancy circuit means further comprises:
- a fuse member; and
- circuit path switcher means for cutting off said fuse member to cause the defective cell block to be electrically replaced with a selected spare cell block.

* * * * *